(12) United States Patent
Merlet et al.

(10) Patent No.: US 7,209,350 B2
(45) Date of Patent: Apr. 24, 2007

(54) VENTILATION SYSTEM FOR ELECTRICAL OF ELECTRONIC EQUIPMENT

(75) Inventors: Etienne Merlet, Montigny le Bretonneux (FR); Jean-Eric Besold, Saclay (FR)

(73) Assignee: Sagem SA, Paris (FR)

( * ) Notice: Subject to any disclaimer, the term of this patent is extended or adjusted under 35 U.S.C. 154(b) by 318 days.

(21) Appl. No.: 11/002,215

(22) Filed: Dec. 3, 2004

(65) Prior Publication Data

US 2005/0135058 A1 Jun. 23, 2005

(30) Foreign Application Priority Data

Dec. 23, 2003 (FR) .................................. 03 15315

(51) Int. Cl.
*H05K 7/20* (2006.01)
(52) U.S. Cl. ....................... 361/694; 361/695; 454/184
(58) Field of Classification Search ........ 361/694–695; 454/184
See application file for complete search history.

(56) References Cited

U.S. PATENT DOCUMENTS

| | | | |
|---|---|---|---|
| 4,648,007 A * | 3/1987 | Garner | 361/695 |
| 5,409,419 A * | 4/1995 | Euchner et al. | 454/184 |
| 5,438,226 A | 8/1995 | Kuchta | |
| 5,890,959 A | 4/1999 | Pettit et al. | |
| 6,042,348 A | 3/2000 | Aakalu et al. | |
| 6,061,237 A * | 5/2000 | Sands et al. | 361/695 |
| 6,104,003 A | 8/2000 | Jones | |
| 6,115,250 A * | 9/2000 | Schmitt | 361/695 |
| 6,252,770 B1 * | 6/2001 | Yu et al. | 361/695 |
| 6,822,863 B1 * | 11/2004 | Artman et al. | 361/695 |

* cited by examiner

*Primary Examiner*—Greg Thompson
(74) *Attorney, Agent, or Firm*—Stites & Harbison PLLC; Douglas E. Jackson

(57) ABSTRACT

A ventilation system for electrical or electronic equipment installed in an enclosure of a box having an air inlet and an air outlet for establishing a flow of air through said enclosure, the ventilation system having at least two air suction sources, namely a primary source and a secondary source, and a chest for mounting on said box beside the air outlet, said chest defining at least two separate cavities, both for connection to the air outlet, namely a primary cavity connected to the primary source, and a secondary cavity connected to the secondary source, in such a manner as to create two separate air exhaust circuits from the outlet of the enclosure.

14 Claims, 6 Drawing Sheets

VENTILATION SYSTEM FOR ELECTRICAL OF ELECTRONIC EQUIPMENT

The invention relates to cooling electrical or electronic equipment.

More precisely, the invention relates to a ventilation system for electrical or electronic equipment installed in an enclosure of a box in which it is desired to establish a flow and then an extraction of air for cooling the equipment in operation.

BACKGROUND OF THE INVENTION

The inventors came across the problems associated with apparatus of this type in the field of aviation. In aircraft, where mechanical, and above all thermal, constraints are significant, it is essential to ensure that the system for ventilating electrical or electronic equipment is reliable so as to ensure that the equipment will be cooled under all circumstances. When the equipment constitutes electronic circuits for automatic pilot control (or any other vital system), it will readily be understood that faulty ventilation, which would inevitably lead to the circuits overheating, could have consequences that are disastrous for the safety of the aircraft.

The European patent application published under the No. EP-0 588 414 discloses a forced air cooling system for electronic equipment, the system comprising:

an enclosure surrounding the components of the electronic equipment, said enclosure defining a path for the flow of cooling air;

a first blower mounted on the air flow path so that practically all of said flow passes through the first blower;

a second blower also mounted on the air flow path so that practically all of the air flow passes through the second blower;

breakdown detector means; and switch means responding to the breakdown detector means to switch one of the blowers from an out-of-service mode to an in-service mode so as to compensate for the effect of the breakdown.

That type of system gives satisfaction in the sense that it enables a breakdown, to be taken into account, and in spite of the breakdown it enables cooling of the electronic equipment to be maintained. Nevertheless, when a breakdown occurs, the blower that has broken down then constitutes an obstacle to air flow, since as mentioned above, practically all of the air flow passes through the blower.

OBJECTS AND SUMMARY OF THE INVENTION

The invention seeks to remedy the above-mentioned drawbacks in particular by proposing a ventilation system that enables cooling that is both effective and uniform to be ensured for electrical or electronic equipment, even in the event of a breakdown affecting up to 50% of the ventilation capacity of the system.

To this end, in a first aspect, the invention provides a ventilation system for electrical or electronic equipment installed in an enclosure of a box having an air inlet and an air outlet for establishing a flow of air through said enclosure, which has at least two air suction sources, namely a primary source and a secondary source, and a chest for mounting on said box beside the air outlet, said chest defining at least two separate cavities, both for connection to the air outlet, namely a primary cavity connected to the primary source, and a secondary cavity connected to the secondary source.

As a result, two separate air exhaust circuits are established at the outlet from the enclosure.

When both suction sources are in operation, i.e. when the ventilation system can operate at full capacity, air is sucked by both sources together. Since the air exhaust circuits are separated by the partitioning between the cavities, there is no risk of head loss being transferred from one circuit to the other. As a result, each of the suction sources operates independently, to the benefit of the overall reliability of the ventilation system.

Furthermore, in the event of one of the suction sources breaking down, leading to a loss of 50% of the ventilation capacity of the system, there is no risk of the source that is still in operation establishing a reverse flow of air from the source that has broken down, since the air exhaust circuits are separated, given that the cavities are partitioned, i.e. are isolated from each other.

In a first embodiment, the chest defines two cavities that are interleaved, being separated by a continuous partition.

In which case, the cavities are preferably symmetrical; for example they may present central symmetry.

For example, the partition extends in a crenellated pattern so that each cavity is comb-shaped.

In a second embodiment, the chest has a plurality of primary cavities and a plurality of secondary cavities in alternation, the primary cavities being connected to the primary source and the secondary cavities being connected to the secondary source.

In which case, the cavities are separated by a plurality of parallel partitions isolating the primary cavities from the secondary cavities.

In a preferred embodiment, the chest defines a primary chamber through which the or each primary cavity is in fluid connection with the primary source, and a secondary chamber through which the or each secondary cavity is in flow connection with the secondary source.

In addition, the chest preferably includes a main wall separating each cavity from the corresponding chamber, said main wall being provided with at least one primary opening through which the primary cavity communicates with the primary chamber, and with at least one secondary opening through which the secondary cavity communicates with the secondary chamber.

By way of example, each suction source may be a fan mounted on the chest.

In a variant, each suction source comprises a blower.

In a second aspect, the invention provides apparatus for cooling electrical or electronic equipment, which apparatus includes a box defining an enclosure for receiving said equipment, the box having an air inlet and an air outlet for creating a flow of air through said enclosure, and it includes a ventilation system having at least two air suction sources, i.e. a primary source and a secondary source, together with a chest mounted on said box beside the air outlet, said chest defining at least two separate cavities, both connected to the air outlet, namely a primary cavity connected to said primary source, and a secondary cavity connected to said secondary source.

By way of example, the air outlet from the box is formed by a perforated top wall.

Preferably, the cavities together cover the entire area of the air outlet so as to maximize the flow rate of air exhausted by the suction sources.

BRIEF DESCRIPTION OF THE DRAWINGS

Other objects and advantages of the invention appear in the light of the following description given with reference to the accompanying drawings, in which.

MORE DETAILED DESCRIPTION

Figure 1:
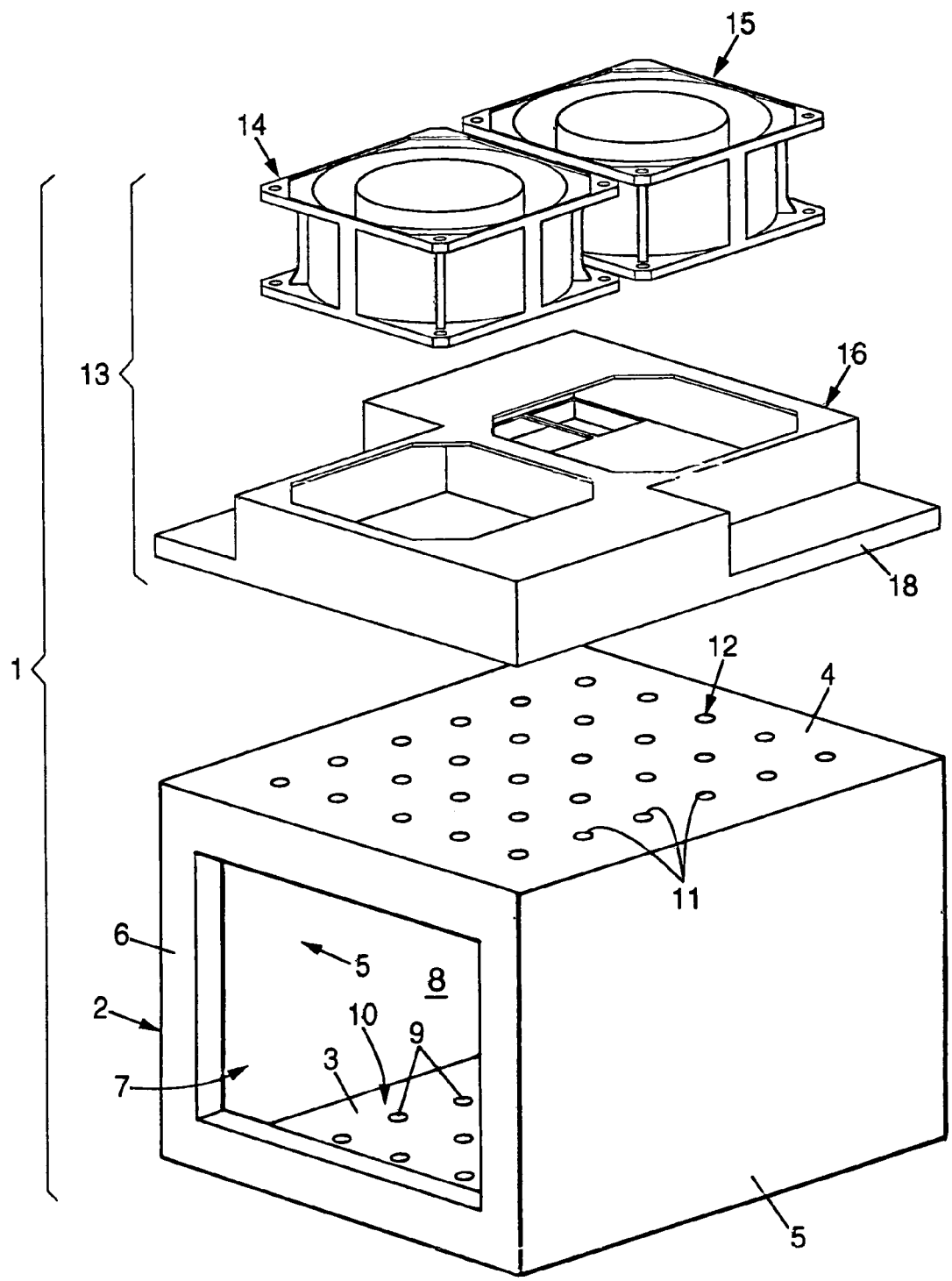
FIG. 1 is an exploded perspective view from above showing apparatus for cooling electrical or electronic equipment.

FIG. 1 shows apparatus 1 for cooling electrical or electronic equipment. The apparatus 1 comprises a rectangular box 2, e.g. made of metal, or metal-plated when electromagnetic protection needs to be provided, which box 2 presents a bottom wall 3, whereby the box 2 stands on a support (not shown), and an opposite top wall 4, the top and bottom walls being interconnected by side walls 5 and 6, the three of which are closed, and one of which, a "front" wall 6, has an opening 7.

The walls 5 and 6 of the box 2 together define an enclosure 8 which receives the electrical or electronic equipment once it has been inserted via the opening 7, which equipment may be constituted by a plurality of circuit cards carrying integrated circuits, e.g. for the purpose of controlling the automatic pilot of an aircraft.

As can be seen in FIG. 1, the bottom wall 3 of the box 2 is provided with a plurality of perforations 9 putting the enclosure 8 into communication with ambient air so as to constitute an air inlet 10. Similarly, the top wall 4 is provided with a plurality of perforations 11 which, opposite from the bottom wall 3, form an air outlet 12 for co-operating with the air inlet 10 to establish a flow of air through the enclosure 8 for the purpose of cooling the electrical or electronic equipment.

The support on which the box 2 stands may be provided with integrated ventilation connected to the electrical power supply of the premises in which the apparatus 1 is located, and specifically to the general electrical power supply of the aircraft. When such ventilation exists, it might suffer a breakdown. Thus proposals have been made to fit the apparatus 1 with an air extractor system 13 for performing forced ventilation of the enclosure 8.

Figure 2:
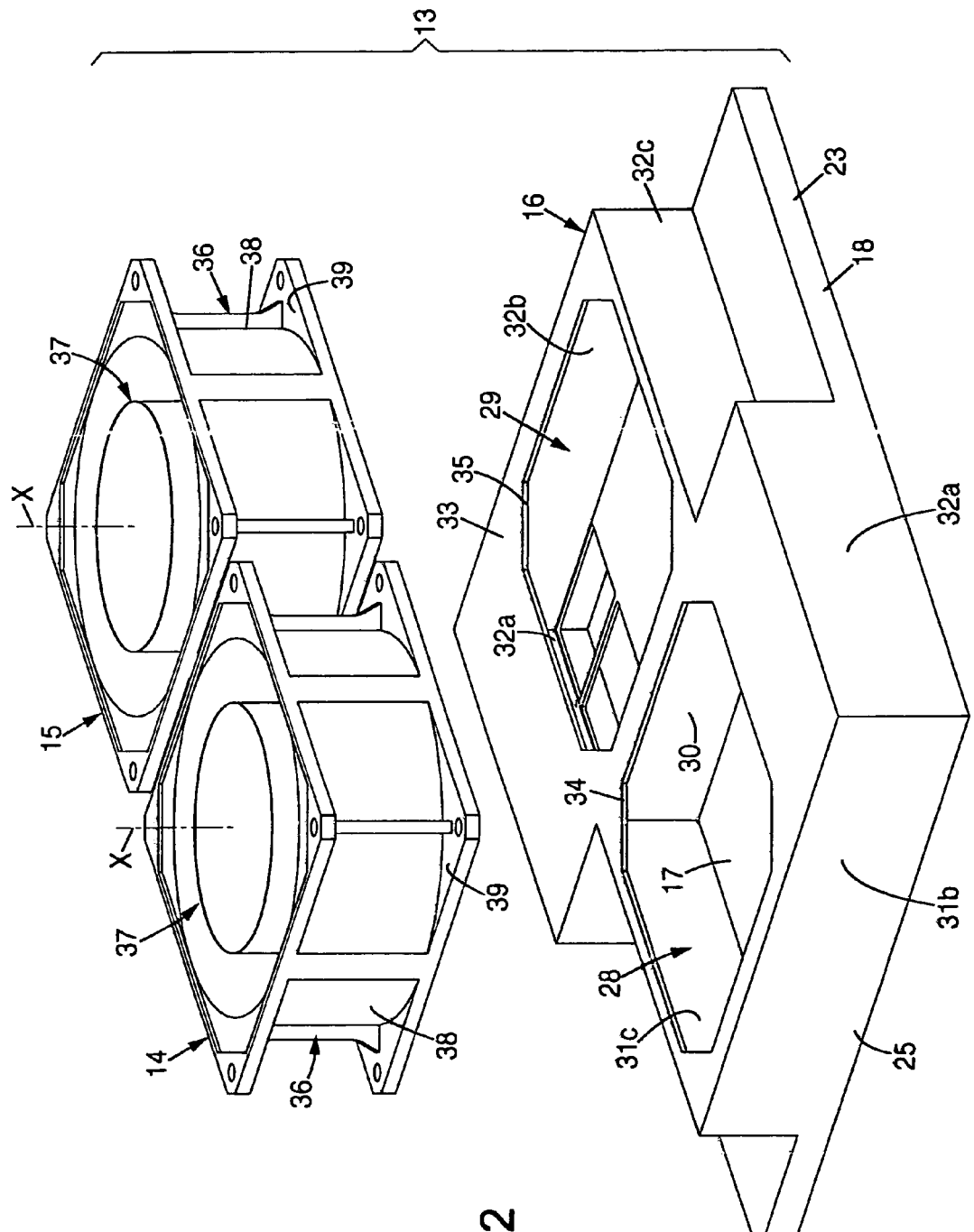
FIG. 2 is an exploded perspective view from above of a detail of FIG. 1, showing the ventilation system of the FIG. 1 apparatus, in a first embodiment.

The air extractor system 13 includes at least two air suction sources, formed respectively by two fans 14 and 15 (there being exactly two such sources in the example shown in FIGS. 1 and 2), namely a primary fan 14 and a secondary fan 15 mounted on a chest 16, which in turn is secured to the box 2 on its top wall 4, where it covers the air outlet 12.

This chest 16 is designed to generate two separate air exhaust circuits at the outlet from the enclosure 8, namely a primary circuit going through the primary fan 14 and a secondary circuit going through the secondary fan 15. The way in which these two circuits are made is described below.

Figure 3:
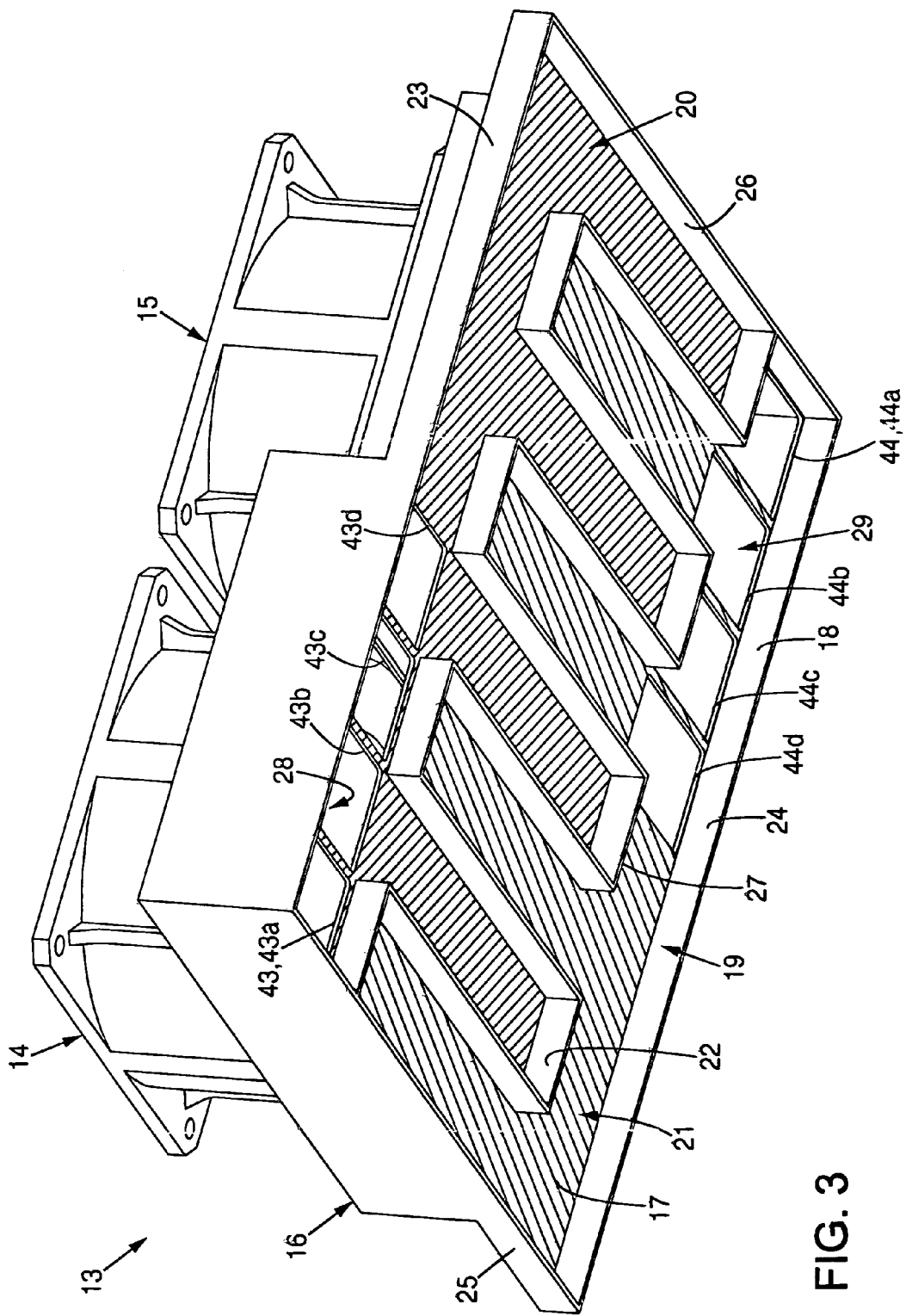
FIG. 3 is a perspective view from below of the ventilation system of FIG. 2, shown assembled.

As can be seen in FIG. 3, the chest comprises a main wall 17 that is substantially parallel to the top wall 4 of the box 2, and that is surrounded by a skirt 18 which projects towards the box 2, thereby enabling the chest 16 to be fitted on the box 2.

The wall 17 and the skirt 18 together define a volume 19 that overlies the air outlet 12, when the chest 16 is in place on the box 2.

As can be seen in particular in FIG. 3, the volume 19 is subdivided into at least two cavities 20, 21 that are separated by a partition 22 interconnecting two opposite sides 23, 24, or 25, 26 of the skirt 18, the partition 22 projecting from the main wall 17. This partition 22 presents an end surface 27 facing away from the wall 17 and coming to bear against the top wall 4 of the box 2 when the chest 16 is mounted thereon.

Thus, when the chest 16 is mounted on the box 2, the partition 22 isolates the primary cavity 20 from the secondary cavity 21, and air cannot flow directly from one to the other.

As shown in FIG. 2, on the top face of the wall 17, i.e. on its face facing away from the cavities 20 and 21, the chest 16 also defines two chambers 28 and 29 i.e. a primary chamber 28 in fluid connection with the primary fan 14 and through which the air of the primary circuit passes, and a secondary chamber 29 in fluid connection with the secondary fan 15 and through which the air of the secondary circuit passes.

Like the cavities 20 and 21, the chambers 28 and 29 are isolated from each other by a separating partition 30 which projects from the wall 17, from the top face thereof.

As visible in FIG. 2, the chambers 28 and 29 are surrounded by side walls 31a, 31b, & 31c, and 32a, 32b, & 32c that project from the top face of the main wall 17 and that are surmounted by a top wall 33 having two windows 34, 35 formed therein, i.e. a primary window 34 giving access to the primary chamber 28, and a secondary window 35 giving access to the secondary chamber 29.

As shown in FIGS. 1 to 3, each fan 14, 15 comprises a box 36 in which a rotor 37 is mounted to rotate about an axis X that is stationary relative to the box 36. Each box 36 has an essentially cylindrical side wall 38 which is shown parallel to the axis X of the rotor 37 and which has a bottom end 39 shaped to form an assembly plate enabling the box 36 to be secured to the chest 16 (e.g. by means of screws), so as to overlie the corresponding window 34 or 35.

In the example shown, the fans 14 and 15 are axial fans (i.e. they exhaust air parallel to their respective axes of rotation X), but they could be radial (centrifugal) blowers, exhausting air perpendicularly to their axes X.

As shown, in particular in FIG. 3, the chest 16 is provided with openings 43, 44 formed through the wall 17 to put the cavities 20 and 21 into fluid communication with the chambers 28 and 29, and in particular:

at least one primary opening 43 formed in register with the primary cavity 20 so as put it into fluid flow communication with the primary chamber 28; and at least one secondary opening 44 formed in register with the secondary cavity 21 so as to put it into fluid flow communication with the secondary chamber 29.

Thus, on leaving the box 2, the air of the primary circuit passes via the primary cavity 28, transits through the primary openings 43, and passes through the primary chamber 28 prior to being expelled by the primary fan.

The air of the secondary circuit, on leaving the box 2, passes via the secondary cavity 21, transits through the secondary openings 44, and passes through the secondary chamber 29 prior to being expelled by the secondary fan.

Two embodiments of the chest 16 are described below, depending on the number and shape of the cavities 20 and 21.

Figure 4:
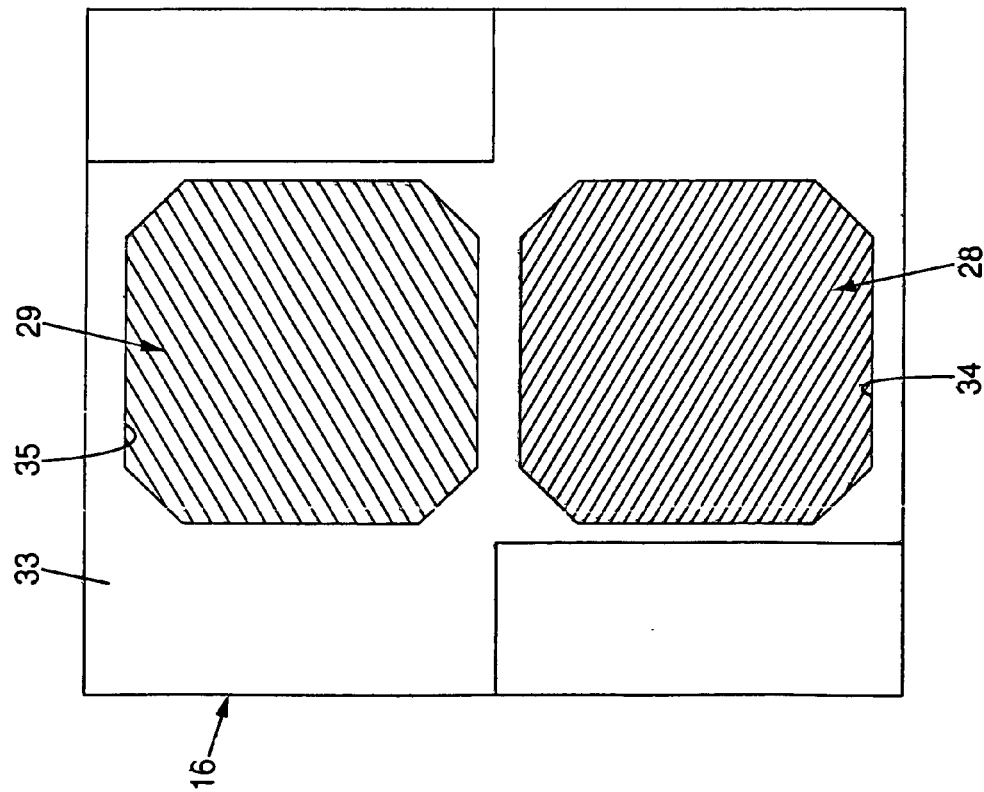
FIG. 4 is a plan view from above of the chest of the ventilation system of FIGS. 2 and 3.
Figure 8:
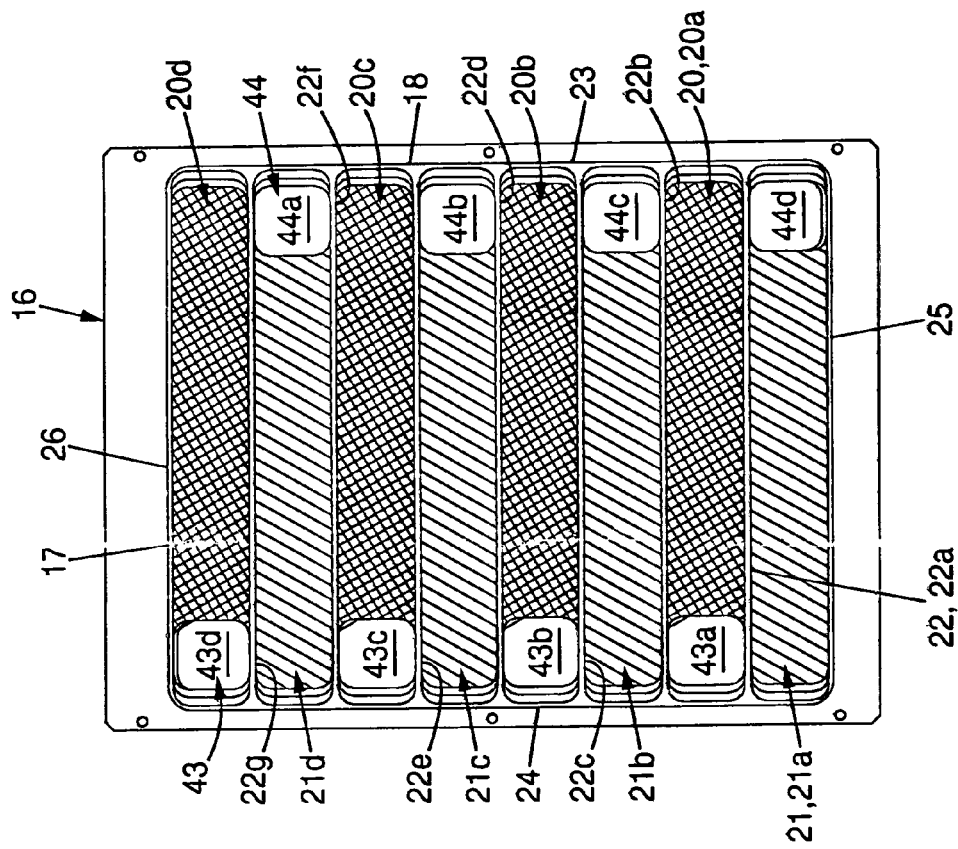
FIG. 8 is a plan view from beneath of the chest shown in FIGS. 6 and 7.
Figure 6:
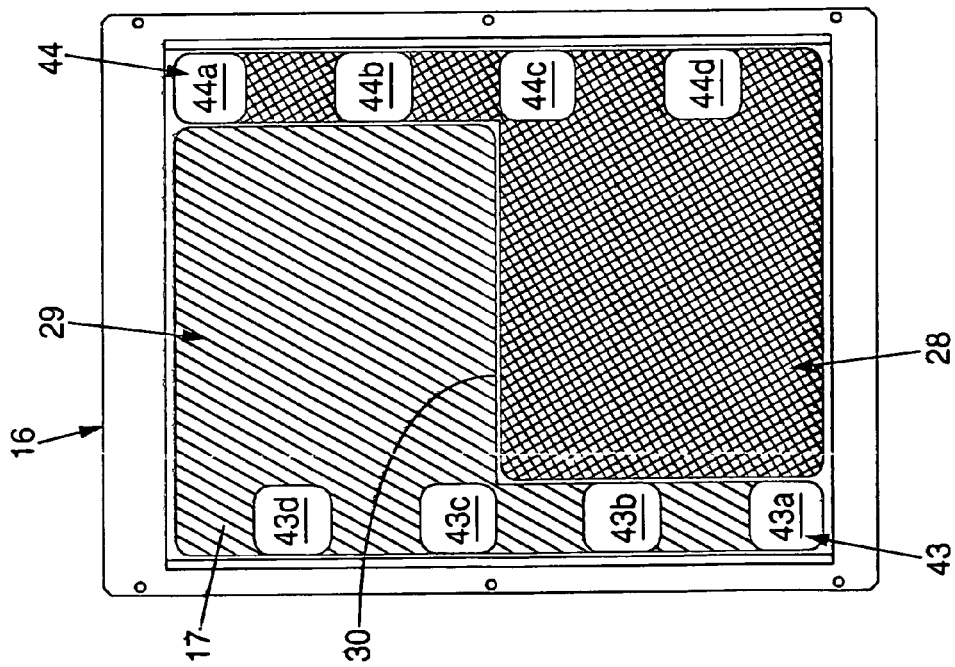
FIG. 6 is a cutaway plan view from above of the chest in a second embodiment.
Figure 9:
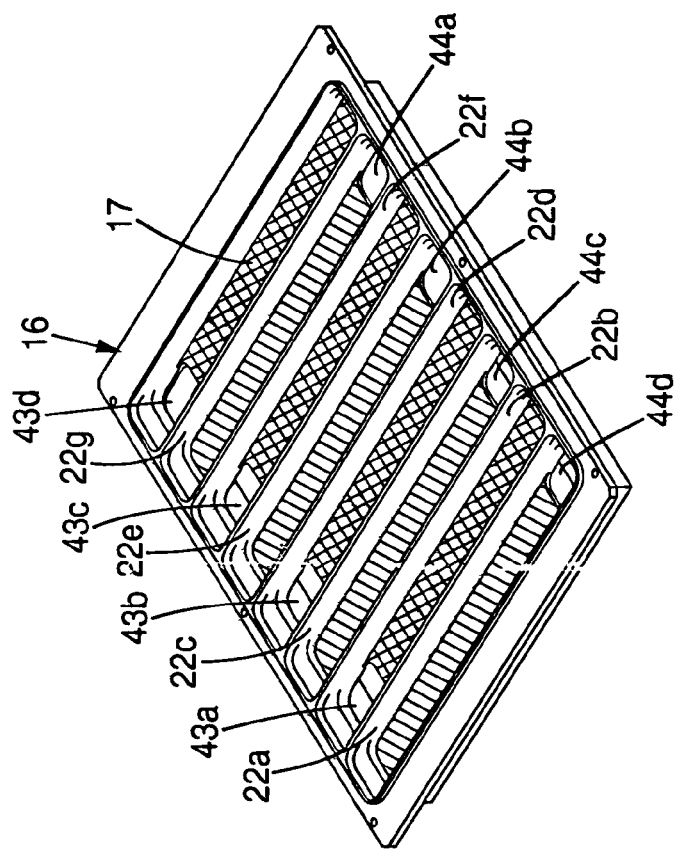
FIG. 9 is a perspective view from beneath of the chest shown in FIGS. 6 to 8.
Figure 7:
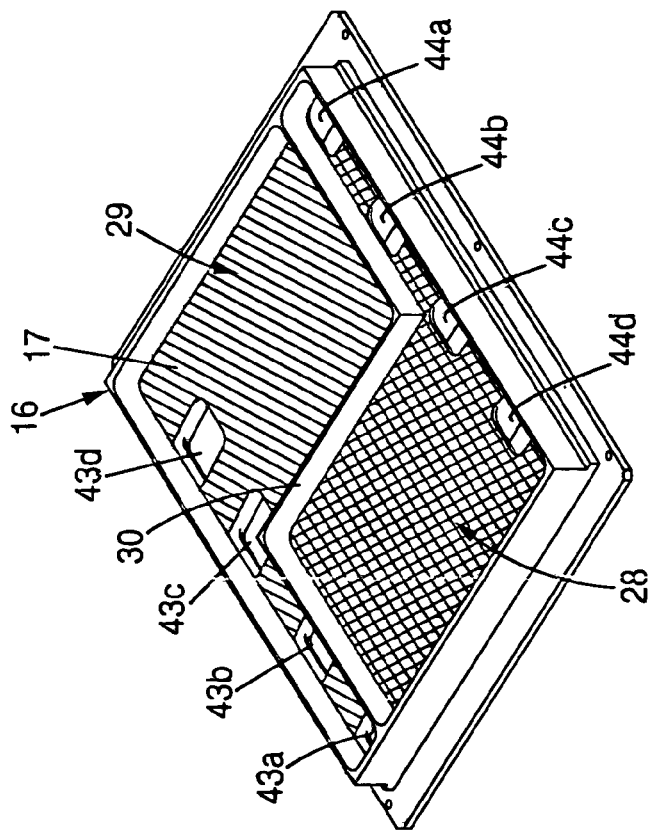
FIG. 7 is a partially cutaway perspective view from above of the FIG. 6 chest.

In a first embodiment, described with reference to FIGS. 3 to 5, the chest 16 has exactly two cavities 20 and 21 each in the shape of a comb, the two combs being interleaved one in the other and being separated by a continuous partition 22 extending along a crenellated pattern.

If the cavities 20 and 21 together cover the entire area of the air outlet 12, interleaving them enables each to take air from practically all of that area.

As a result, in the event of one of the air circuits, the primary circuit or secondary circuit, being inoperative due to a breakdown affecting one of the fans 14 and 15, the flow of air through the circuit that remains operational remains substantially uniform over the entire air outlet 12.

As a result, given the shape of each of the cavities 20 and 21, the suction caused by the fans 14 and 15 generates parallel upwardly-traveling sheets of air inside the enclosure 8 which penetrate into the perforations 9 and subsequently follow the two separate exhaust circuits.

In the event of one of the fans, e.g. the primary fan 14, breaking down, the secondary fan 15 generates upwardly-flowing sheets of air inside the enclosure 8 which, by inertia, entrain the appearance of likewise upward flows of air between said sheets, which flows pass through the perforations 9 into the primary cavity 20 and are exhausted via the primary circuit in spite of the fact that the corresponding fan 14 has stopped. Since the perforations 11 lead to head losses, there is no risk of a looped flow of air becoming established within the enclosure 8.

The person skilled in the art will take care to ensure that each air circuit presents a suitable flow rate. For this purpose, the sections of the openings 43 and 44 can be varied. Specifically, a plurality of primary openings 43 and secondary openings 44 are formed through the main wall 17. In the example shown in FIGS. 3 and 5, a row of four primary openings 43a, 43b, 43c, and 43d is provided in the wall 17 so as to put the primary cavity 20 into communication with the primary chamber 28, and a row of four secondary openings 44a, 44b, 44c, and 44d is provided through the wall 17 so as to put the secondary cavity 21 into communication with the secondary chamber 29.

Figure 5:
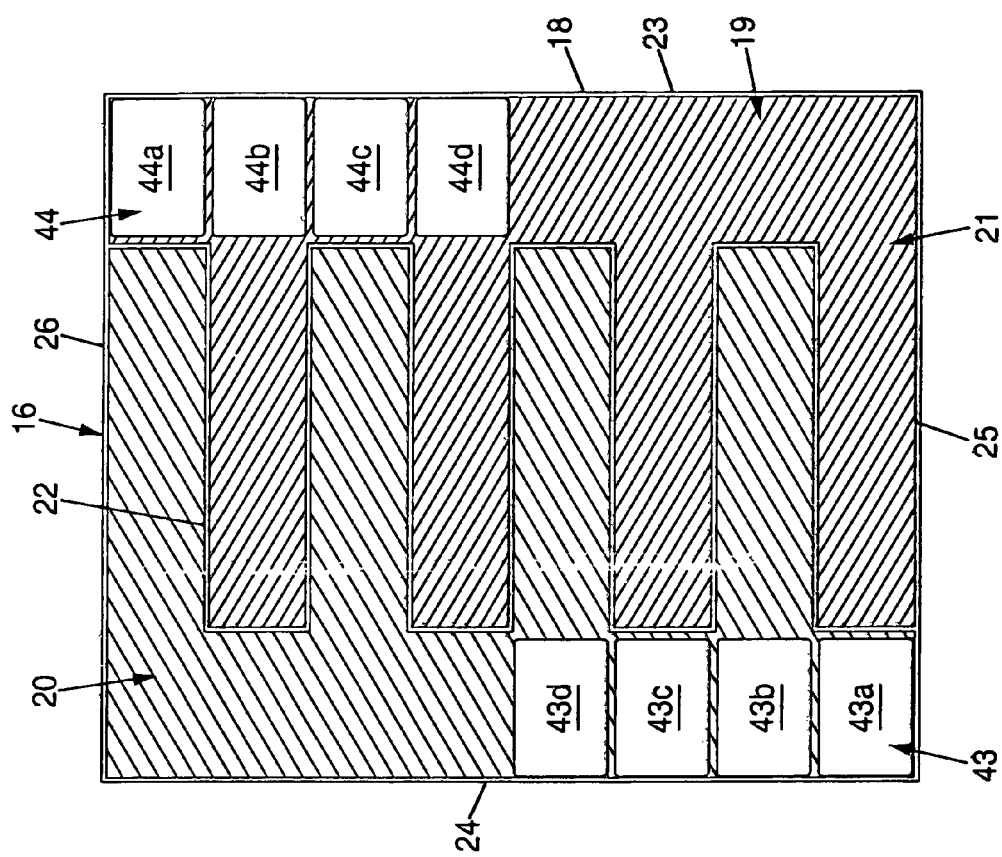
FIG. 5 is a plan view from beneath of the FIG. 4 chest.

As can be seen in FIG. 5, the primary openings 43a, 43b, 43c, and 43d and the secondary openings 44a, 44b, 44c, and 44d are grouped together in two diagonally opposite corners of the wall 18, but they could be distributed more uniformly therealong.

In addition, as can also be seen in FIG. 5, the cavities 20 and 21 are symmetrical relative to each other. More precisely, they present central symmetry about a middle axis of the chest 16 extending perpendicularly to the wall 17.

As a result, firstly when both fans 14 and 15 are in operation, the flow of air through the enclosure 8 is substantially uniform, and secondly, in the event of a breakdown occurring, it does not matter whether the breakdown affects one or the other of the fans 14 and 15.

In addition, because the presence of the perforations 11 in the top wall 4 of the box 2 leads to head loss, the appearance of a looped flow of air inside the box is prevented by the head loss that is generated by the perforations at the air outlet from the box.

In a second embodiment, shown in FIGS. 6 to 9, the chest 16 has a plurality of primary cavities 20a, 20b, 20c, and 20d and a plurality of secondary cavities 21a, 21b, 21c, and 21d, in alternation, and separated in pairs by a plurality of parallel partitions 22a to 22g (which partitions are linear in the example shown) interconnecting two opposite edges 25 and 26 of the skirt 18.

A primary opening 43a, 43b, 43c, or 43d is formed through the wall 17 in the vicinity of one of the sides 23 for each of the primary cavities 20a, 20b, 20c, or 20d, and a secondary opening 44a, 44b, 44c, or 44d is formed in the vicinity of the opposite side for each of the secondary openings 21a, 21b, 21c, or 21d.

As a result, the primary cavities 20a to 20d are all in fluid flow communication with the primary chamber 28, while the secondary cavities 21a to 21d are all in fluid flow communication with the secondary chamber 29.

Given the symmetry and the uniformity of this configuration, the advantages in terms of air flow are the same as those mentioned above when describing the first embodiment.

What is claimed is:

1. A ventilation system for electrical or electronic equipment installed in an enclosure of a box having an air inlet and an air outlet for establishing a flow of air through said enclosure, the ventilation system having at least two air suction sources, namely a primary source and a secondary source, and a chest for mounting on said box beside the air outlet, said chest defining at least two separate cavities, both for connection to the air outlet, namely a primary cavity connected to the primary source, and a secondary cavity connected to the secondary source.

2. A ventilation system according to claim 1, in which the cavities are interleaved and separated from each other by a continuous partition.

3. A ventilation system according to claim 2, in which the cavities are symmetrical relative to each other.

4. A ventilation system according to claim 3, in which the cavities present central symmetry relative to each other.

5. A ventilation system according to claim 2, in which the separating partition extends in a crenellated pattern, each cavity being in the form of a comb.

6. A ventilation system according to claim 1, in which the chest defines a plurality of primary cavities and a plurality of secondary cavities in alternation, the primary cavities being connected to the primary source, while the secondary cavities are connected to the secondary source.

7. A ventilation system according to claim 6, in which the secondary cavities are separated from the primary cavities by a plurality of parallel partitions.

8. A ventilation system according to claim 1, in which the chest defines a primary chamber via which the or each primary cavity is connected to the primary source, and a secondary chamber via which the or each secondary cavity is connected to the secondary source.

9. A ventilation system according to claim 8, in which the chest comprises a main wall which separates each of the cavities from the corresponding chamber, said wall being provided with at least one primary opening whereby the primary chamber communicates with the or each primary cavity, and with at least one secondary opening whereby the secondary chamber communicates with the or each secondary cavity.

10. A ventilation system according to claim 1, in which each air suction source is a fan mounted on said chest.

11. A ventilation system according to claim 1, in which each air suction source comprises a radial blower.

12. Apparatus for cooling electrical or electronic equipment, which apparatus includes a box defining an enclosure for receiving said equipment, the box having an air inlet and an air outlet for creating a flow of air through said enclosure, said apparatus including a ventilation system having at least two air suction sources, i.e. a primary source and a secondary source, together with a chest mounted on said box beside the air outlet, said chest defining at least two separate cavities, both connected to the air outlet, namely a primary cavity connected to said primary source, and a secondary cavity connected to said secondary source.

13. Apparatus according to claim 12, in which the air outlet from the box is formed by a perforated top wall.

14. Apparatus according to claim 12, in which the cavities together cover the entire area of the air outlet.

* * * * *